United States Patent [19]
Irwin et al.

[11] Patent Number: 5,339,278
[45] Date of Patent: Aug. 16, 1994

[54] METHOD AND APPARATUS FOR STANDBY RECOVERY IN A PHASE LOCKED LOOP

[75] Inventors: James S. Irwin, Paige; David F. Moeller; Karl J. Huehne, both of Austin, all of Tex.

[73] Assignee: Motorola, Inc., Schaumburg, Ill.

[21] Appl. No.: 44,790

[22] Filed: Apr. 12, 1993

[51] Int. Cl.⁵ .............................................. H03L 7/00
[52] U.S. Cl. ...................................... 331/16; 331/14; 331/1 A
[58] Field of Search .................. 331/16, 14, 17, 25, 331/DIG. 2, 1 A

[56] References Cited

U.S. PATENT DOCUMENTS

| | | | |
|---|---|---|---|
| 3,921,095 | 11/1975 | Chu | 331/14 |
| 4,005,479 | 1/1977 | Hunnicutt et al. | 331/1 A |
| 4,103,250 | 7/1978 | Jackson | 331/1 A |
| 4,123,724 | 10/1978 | Das et al. | 331/1 A |
| 4,330,758 | 5/1982 | Swisher et al. | 331/16 |
| 4,378,509 | 3/1983 | Hatchett et al. | 331/1 A |
| 4,410,860 | 10/1983 | Kipp et al. | 331/1 A |
| 4,521,858 | 4/1985 | Charavit et al. | 331/10 |
| 4,667,169 | 5/1987 | Matsuura et al. | 331/14 |
| 4,673,892 | 6/1987 | Miyashita et al. | 331/14 |
| 4,714,899 | 12/1987 | Kurtzman et al. | 331/1 A |
| 4,743,864 | 5/1988 | Nakagawa et al. | 331/1 A |
| 4,817,199 | 3/1989 | Wallraff | 455/260 |
| 4,918,403 | 4/1990 | Martin | 331/1 A |
| 4,951,005 | 8/1990 | Babin | 331/16 |

FOREIGN PATENT DOCUMENTS

0272938A2 12/1987 European Pat. Off. ....... H03L 7/18

*Primary Examiner*—Raymond A. Nelli
*Attorney, Agent, or Firm*—Paul J. Polansky

[57] ABSTRACT

A phase locked loop (20) includes a standby control circuit (30) and recovers from standby with minimum lock time. A reference counter (21), a loop counter portion (22, 23) and a phase detector (24) are disabled in response to an activation of a standby signal. Both the reference counter (21) and the loop counter portion (22, 23) are enabled in response to a deactivation of the standby signal. A voltage controlled oscillator (VCO) (26) output signal is decoupled from an input of the loop counter portion (22, 23) in response to an activation of a loop counter output signal. The VCO output signal is next recoupled to the input of the loop counter portion (22, 23) in response to an activation of a reference counter output signal. Finally, the phase detector (24) is enabled. In one embodiment, the loop counter portion (22, 23) includes a prescaler (22) which does not have a separate reset input, and a separate loop counter (23).

12 Claims, 2 Drawing Sheets

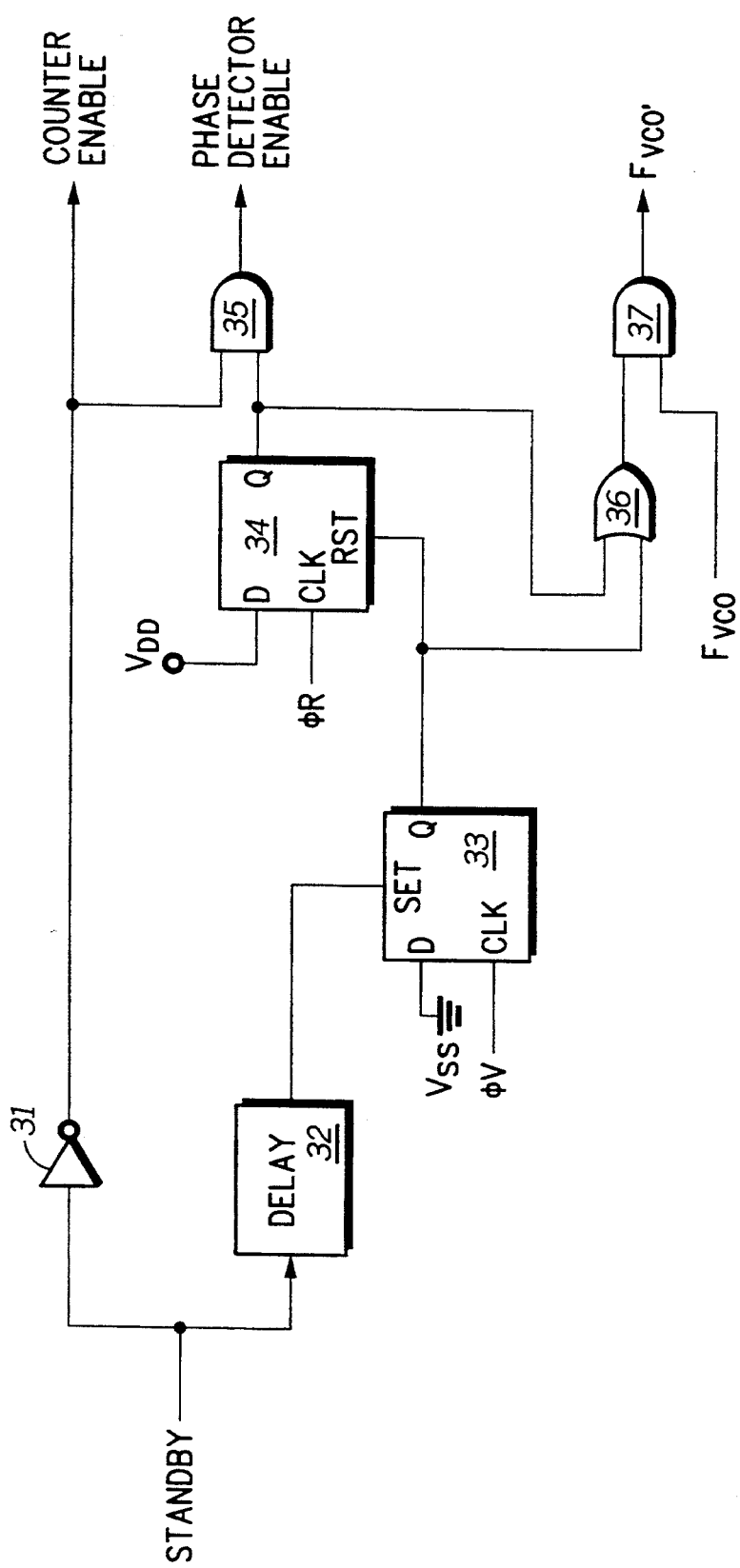

METHOD AND APPARATUS FOR STANDBY RECOVERY IN A PHASE LOCKED LOOP

FIELD OF THE INVENTION

This invention relates generally to phase locked loops, and more particularly, to standby methods and circuits for phase locked loops.

BACKGROUND OF THE INVENTION

Phase locked loops (PLLs) have important uses in communications applications. One such use, a PLL frequency synthesizer, generates an output signal having a programmable frequency to be used in tuning two or more communication channels. A reference oscillator generates a reference signal which is counted in a reference counter to provide a first input of a phase detector. An output of a loop counter provides a second input of the phase detector. The phase detector provides a voltage indicative of whether the inputs thereof are in lock, i.e. have the same phase and frequency. The phase detector output is filtered in a loop filter such as an integrator, the output of which provides an input to a voltage controller oscillator (VCO). The output of the VCO, which is the output of the PLL frequency synthesizer, is then divided in the loop counter. If a different output frequency is desired, the user need only change the starting counter value of the reference counter or the loop counter, and the feedback loop of the PLL frequency synthesizer causes the output frequency to quickly lock.

In many applications, the output of the VCO has a relatively large frequency in relation to the reference frequency. For example, the VCO may be programmed to output a signal having a frequency of 1.2 gigahertz (GHz). Because this frequency is too high for division in complementary metal-oxide-semiconductor (CMOS) circuitry, the loop counter is usually broken down into two components: a prescaler, and a subsequent counter also referred to as the loop counter. The prescaler can then be made with higher-speed bipolar circuitry, while the loop counter is implemented in CMOS circuitry.

Low power consumption is a key consideration in many products using PLL frequency synthesizers. Thus, these products often place the PLL frequency synthesizer in a standby mode to save power. While in standby mode, the prescaler, counters, and phase detector are disabled to save power. The input to the VCO remains substantially constant, causing the VCO output to maintain approximately the same frequency as before the PLL frequency synthesizer entered standby. This creates a problem on exiting standby, however. During standby, the output of the VCO may have drifted in phase, but not in frequency. Additionally, when the counters are re-enabled, they are not synchronized and the phase detector will detect a large error, even though this error reflects a change in phase rather than in frequency. Because of the spurious detection of this large error, the VCO changes its output frequency even though the desired frequency may be correct. Thus, the PLL takes an undesirably long time to lock.

In addition, integrated circuit prescalers commonly do not have reset inputs. These integrated circuits need low pin counts to minimize cost. In addition, they would require an extra switching transistor stacked in each stage to incorporate a reset function, increasing voltage requirements and power consumption and size. Thus, what is needed is a PLL frequency synthesizer which locks quickly after standby and which interfaces easily to available prescaler circuits.

SUMMARY OF THE INVENTION

Accordingly, there is provided, in one form, a method for improving standby recovery in a phase locked loop. A reference counter, a loop counter portion, and a phase detector are disabled in response to an activation of a standby signal. Both the reference counter and the loop counter portion are enabled in response to an inactivation of the standby signal. A voltage controlled oscillator (VCO) output signal is decoupled from an input of the loop counter portion in response to an activation of a loop counter output signal. The VCO output signal is recoupled to the input of the loop counter portion in response to an activation of a reference counter output signal. The phase detector is then enabled.

In another form, there is provided a standby control circuit for a phase locked loop comprising a counter enable portion, a gating portion, and a phase detector enable portion. The counter enable portion activates or deactivates a counter enable signal, respectively in response to a deactivation or an activation of a standby signal. The gating portion provides a voltage controlled oscillator (VCO) output signal at a predetermined logic state in response to a first occurrence of a loop counter output signal after a deactivation of the standby signal. The gating portion also provides the VCO output signal in response to a VCO input signal after a first occurrence of a reference counter output signal after the first occurrence of said loop counter output signal. The phase detector enable portion deactivates a phase detector enable signal in response to an activation of said standby signal, and reactivates the phase detector enable signal in response to the first occurrence of the reference counter output signal after the first occurrence of the loop counter output signal.

These and other features and advantages will be more clearly understood from the following detailed description taken in conjunction with the accompanying drawings.

BRIEF DESCRIPTION OF THE DRAWINGS

FIG. 2 illustrates the standby control circuit of FIG. 1.

DETAILED DESCRIPTION OF A PREFERRED EMBODIMENT

Figure 1:
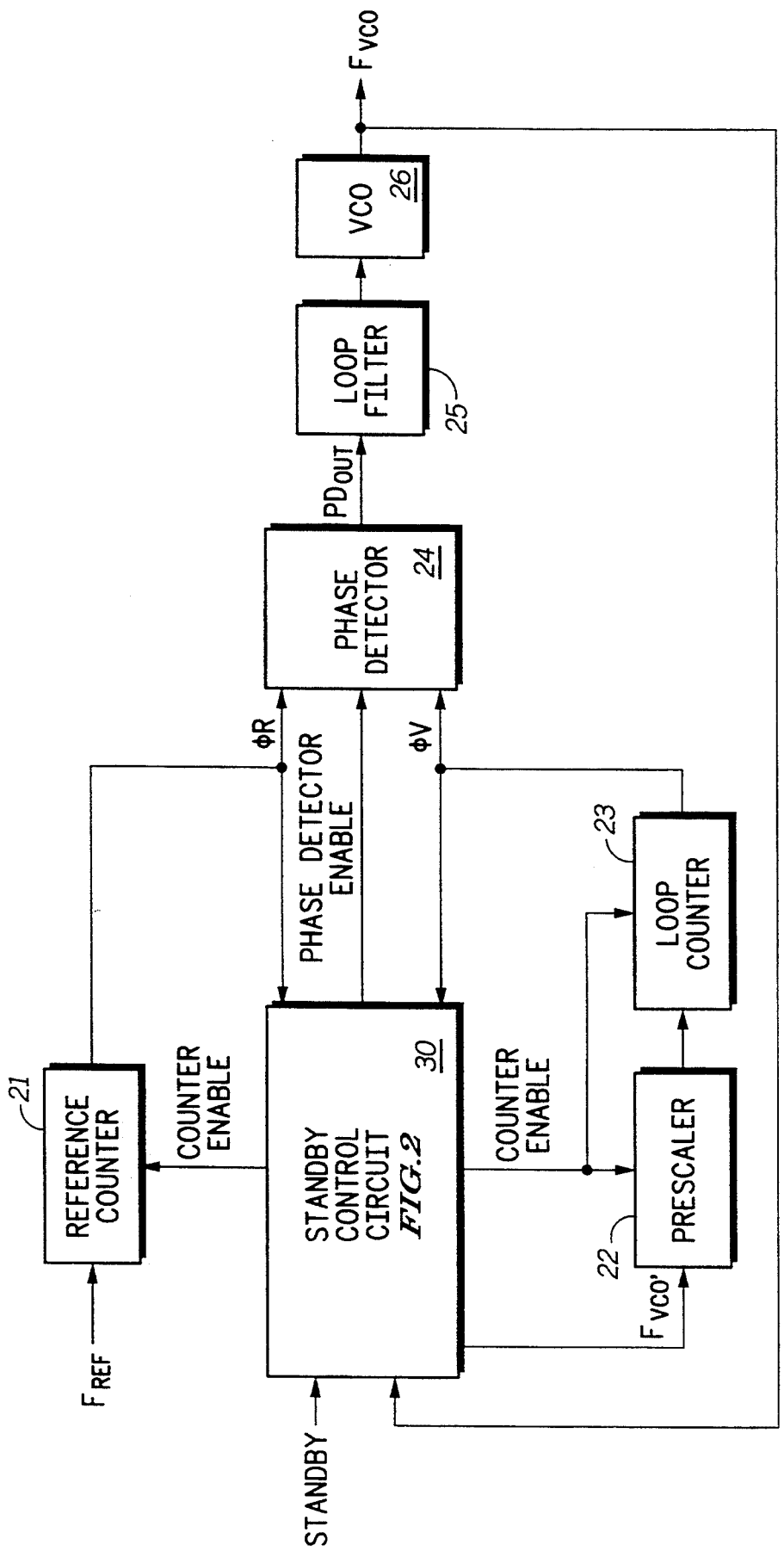
FIG. 1 illustrates in block diagram form a phase locked loop in accordance with the present invention.

FIG. 1 illustrates in block diagram form a phase locked loop (PLL) 20 in accordance with the present invention. PLL 20 includes a reference counter 21, a prescaler 22, a loop counter 23, a phase detector 24, a loop filter 25, a voltage controlled oscillator 26, and a standby control circuit 30. Reference counter 21 has an input for receiving a reference signal labelled "$F_{REF}$" from a source such as a crystal oscillator (not shown), a control input for receiving a signal labelled "COUNTER ENABLE", and an output for providing an output signal labelled "$\Phi R$". Prescaler 22 has an input for receiving a signal labelled "$F_{VCO}$", a control input for receiving COUNTER ENABLE, and an output. Loop counter 23 has an input connected to the output of prescaler 22, a control input for receiving COUNTER ENABLE, and an output for providing a signal labelled "ΦV". Phase detector 24 has first and second inputs respectively receiving signals ΦR and ΦV, a control input for receiving a signal labelled "PHASE DETECTOR ENABLE", and an output for providing a signal labelled "PD$_{OUT}$". Loop filter 25 has an input for receiving PD$_{OUT}$, and an output. VCO 26 has an input connected to the output terminal of loop filter 25, and an output for providing an output of PLL 20 labelled "F$_{VCO}$". Standby control circuit 30 has a first input for receiving signal F$_{VCO}$, a control input for receiving a signal labelled "STANDBY", and output terminals for providing signals F$_{VCO}$', COUNTER ENABLE, and PHASE DETECTOR ENABLE.

In operation, reference counter 21 receives F$_{REF}$ from a reference oscillator (not shown) and counts down from a preprogrammed number to zero. When it reaches a count of zero, reference counter 21 pulses output signal ΦR for one period of F$_{REF}$, and then repeats its counting cycle. Likewise, prescaler 22 counts down from a preprogrammed or predetermined number to zero in response to signal F$_{VCO}$' to provide its output for a given number of cycles of F$_{VCO}$'. The length of time the output of prescaler 22 is active is unimportant because loop counter 23 counts on a low-to-high transition. Prescaler 22 is implemented in bipolar technology, and may either be discrete or implemented with CMOS reference counter 21, loop counter 23, and phase detector 24 on a single integrated circuit using bipolar-CMOS (BICMOS) technology. It should be apparent, however, that prescaler 22 may be implemented in any other circuit technology capable of switching at high radio frequencies (RF), typically in the range of 1.2 GHz or beyond, such as gallium arsenide. The output of prescaler 22 drives the input of loop counter 23, which subsequently provides signal ΦV. Thus the output of VCO 26 is divided by a number determined by the programmed count values of both prescaler 22 and loop counter 23.

Phase detector 24 is a three-state phase detector which either provides a positive current pulse if ΦR leads ΦV, provides a negative current pulse if ΦV leads ΦR, or remains in a high impedance state if ΦR is in phase with ΦV. Loop filter 25 is a conventional lowpass loop filter such as an integrator which maintains a history of PD$_{OUT}$ and provides a corresponding voltage to the input of VCO 26 in response. VCO 26 provides its output, F$_{VCO}$, at a frequency proportional to the voltage at the output of loop filter 25.

Standby control circuit 30 operates to enable and disable the various components of PLL 20 in response to the activation and deactivation of signal STANDBY. When signal STANDBY is activated (indicating the beginning of standby mode), standby control circuit 30 deactivates COUNTER ENABLE and thus reference counter 21, prescaler 22, and loop counter 23 are all disabled. Standby mode thus significantly reduces power consumption of CMOS reference counter 21 and CMOS loop counter 23, since power consumption of CMOS circuitry is proportional to switching speed. Prescaler 22 may also be designed to operate with reduced power during standby mode by techniques such as placing switches activated by signal STANDBY in series with current sources, interrupting the power supply during standby mode, and the like. Standby control circuit 30 also deactivates signal PHASE DETECTOR ENABLE, placing PD$_{OUT}$ in the high impedance state, and maintaining F$_{VCO}$ at the frequency it had at the beginning of standby mode. Standby control circuit 30 passes signal F$_{VCO}$ to its output to provide signal F$_{VCO}$'.

When signal STANDBY is deactivated, standby control circuit 30 first activates COUNTER ENABLE. After the first occurrence of ΦV, standby control circuit 30 does not pass F$_{VCO}$ to F$_{VCO}$', instead driving F$_{VCO}$' to a constant logic low value so that prescaler 22 and loop counter 23 do not decrement. Then, after the first occurrence of ΦR, standby control circuit 30 activates PHASE DETECTOR ENABLE and gates on F$_{VCO}$'. At this point, thus, both reference counter 21 and prescaler 22 and loop counter 23 are locked, and assuming there was no frequency drift during standby, PLL 20 is locked.

Thus, PLL 20 operates with low power consumption during standby mode. PLL 20 also recovers from standby mode without spuriously disrupting the output frequency. In addition, standby control circuit 30 is well-adapted for interface to an off-the-shelf bipolar integrated circuit prescaler that does not have a reset input.

FIG. 2 illustrates the standby control circuit 30 of FIG. 1. Note that standby control circuit 30 is only one possible circuit which may be used to implement PLL 20 of FIG. 1; other circuit configurations are possible, such as one based on negative logic. Standby control circuit 30 includes an inverter 31, a delay element 32, D-type flip flops 33 and 34, an AND gate 35, an OR gate 36, and an AND gate 37. Inverter 31 has an input terminal for receiving signal STANDBY, and an output terminal for providing signal COUNTER ENABLE. Delay element 32 has an input terminal for receiving signal STANDBY, and an output terminal. Flip flop 33 has a data input terminal labelled "D" connected to a power supply voltage terminal labelled "V$_{SS}$", a clock input terminal labelled "CLK" for receiving signal ΦV, a set input terminal labelled "SET" connected to the output terminal of delay element 32, and a true output terminal labelled "Q". V$_{SS}$ is a more-negative power supply voltage terminal which is associated with a logic low voltage level. Flip flop 34 has a D input terminal connected to a power supply voltage terminal labelled "V$_{DD}$", a CLK input terminal for receiving signal ΦR, a RST input terminal connected to the Q output terminal of flip flop 33, and a Q output terminal. V$_{DD}$ is a more-positive power supply voltage terminal which is associated with a logic high voltage level. AND gate 35 has a first input terminal connected to the output terminal of inverter 31, a second input terminal connected to the Q output terminal of flip flop 34, and an output terminal for providing signal PHASE DETECTOR ENABLE. OR gate 36 has a first input terminal connected to the Q output terminal of flip flop 34, a second input terminal connected to the Q output terminal of flip flop 33, and an output terminal. AND gate 37 has a first input terminal connected to the output terminal of OR gate 36, a second input terminal for receiving signal F$_{VCO}$, and an output terminal for providing signal F$_{VCO}$'.

Standby control circuit 30 activates and deactivates signal COUNTER ENABLE in response to a complement of signal STANDBY through the operation of inverter 31. When signal STANDBY is activated (indicating a standby state), the Q output of flip flop 33 is activated at a logic high voltage, which activates the RST input of flip flop 34. Flip flop 34 deactivates its Q output at a logic low, which makes PHASE DETECTOR ENABLE inactive at a logic low regardless of the state of COUNTER ENABLE. Since the Q output of flip flop 33 is at a logic high, the output of OR gate 36 is a logic high. Thus the output of AND gate 37 is determined by the state of $F_{VCO}$, and signal $F_{VCO}'$ is "gated on".

When signal STANDBY is deactivated, the SET input of flip flop 33 is inactive at a logic low, and the logic low voltage at the D input of flip flop 33 appears on the Q output thereof after the first $\Phi V$ pulse at the output of loop counter 23. When this Q output becomes a logic low, the output or OR gate 36 switches to a logic low, causing $F_{VCO}'$ to be a logic low regardless of the state of $F_{VCO}$, and signal $F_{VCO}'$ is "gated off". Thus, prescaler 22 and loop counter 23 remain at the beginning of their decrementing cycle. The RST input of flip flop 34 also becomes inactive at a logic low, and the logic high voltage at the D input of flip flop 34 appears on the Q output thereof after the first $\Phi R$ pulse at the output of reference counter 21. When this Q output is a logic high, AND gate 35 activates signal PHASE DETECTOR ENABLE, and the output of OR gate 36 is driven to a logic high, causing the output of AND gate 37 to change in response to $F_{VCO}$, and signal $F_{VCO}'$ is again gated on. At this point, both reference counter 21 and prescaler 22/loop counter 23 are synchronized at the beginning of their decrement cycles. If VCO 26 has shifted in phase only but not in frequency, thus, PLL 20 has exited standby without causing a frequency error. In addition, PLL 20 operates with a non-resettable prescaler.

Delay element 32 eliminates timing problems in standby control circuit 30 and must have a delay of at least one cycle of $F_{REF}$. This requirement may be accomplished by a series of ratioed inverters sized to guarantee the minimum delay, a one-bit counter connected to $F_{REF}$, or the like.

AND gate 37 must be able to switch at the speed of $F_{VCO}$ and may be implemented with a variety of circuits. One such circuit is a switched buffer. Another such circuit implements the logic function of AND gate 37 as part of a front-end gain stage to prescaler 22. This circuit includes a resistor bias network at an input of the gain stage. Two series resistors are connected between the output of OR gate 36 and $V_{SS}$. The interconnection point of the resistors, which also receives $F_{VCO}$, is connected to the base of an NPN bipolar transistor, the collector of which provides $F_{VCO}$.

While the invention has been described in the context of a preferred embodiment, it will be apparent to those skilled in the art that the present invention may be modified in numerous ways and may assume many embodiments other than that specifically set out and described above. For example, the standby control circuit may be implemented with positive logic, negative logic, or a combination of the two. Different circuits which implement the function of standby control circuit 30 may also be used. Accordingly, it is intended by the appended claims to cover all modifications of the invention which fall within the true spirit and scope of the invention.

We claim:

1. A method for improving standby recovery in a phase locked loop comprising the steps of:
   disabling a reference counter, loop counter means, and a phase detector in response to an activation of a standby signal;
   enabling both said reference counter and said loop counter means in response to an inactivation of said standby signal;
   decoupling a voltage controlled oscillator (VCO) output signal from an input of said loop counter means in response to an activation of a loop counter output signal;
   recoupling said VCO output signal to said input of said loop counter means in response to an activation of a reference counter output signal; and
   enabling said phase detector.

2. The method of claim 1 wherein said step of disabling comprises the step of disabling a loop counter means comprising a prescaler and a loop counter.

3. A standby control circuit for a phase locked loop, comprising:
   counter enable means for activating or deactivating a counter enable signal, respectively in response to a deactivation or an activation of a standby signal;
   gating means for providing a voltage controlled oscillator (VCO) output signal at a predetermined logic state in response to a first occurrence of a loop counter output signal after a deactivation of said standby signal, and for providing said VCO output signal in response to a VCO input signal after a first occurrence of a reference counter output signal after said first occurrence of said loop counter output signal; and
   phase detector enable means for deactivating a phase detector enable signal in response to an activation of said standby signal, and for reactivating said phase detector enable signal in response to said first occurrence of said reference counter output signal after said first occurrence of said loop counter output signal.

4. The standby control circuit of claim 3 wherein said counter enable means comprises an inverter having an input terminal for receiving a standby signal, and an output terminal for providing said counter enable signal.

5. The standby control circuit of claim 3 wherein said gating means comprises:
   a first D flip-flop having a D input coupled to a first reference voltage representative of a first logic state, a clock input terminal for receiving said loop counter output signal, a set input terminal for receiving said standby signal, and a Q output terminal;
   a second D flip-flop having a D input coupled to a second reference voltage representative of a second logic state, a clock input terminal for receiving said reference counter output signal, a reset input terminal coupled to said Q output terminal of said first D flip-flop, and a Q output terminal;
   an OR gate having a first input terminal coupled to said Q output terminal of said first D flip-flop, a second input terminal coupled to said Q output terminal of said second D flip-flop, and an output terminal; and
   an AND gate having a first input terminal coupled to said output terminal of said OR gate, a second input terminal for receiving said VCO input signal, and an output terminal for providing said VCO output signal.

6. The standby control circuit of claim 5 further comprising delay means coupled to said set input of said first D flip-flop, for providing a predetermined delay between a change in logic state of said standby signal and a change in logic state at said set input of said first D flip-flop.

7. The standby control circuit of claim 5 wherein said phase detector enable means comprises a second AND gate having a first input terminal for receiving said counter enable signal, a second input terminal coupled to said Q output terminal of said second D flip-flop, and an output terminal for providing a phase detector enable signal.

8. A standby control circuit for a phase locked loop comprising:

an inverter having an input terminal for receiving a standby signal, and an output terminal for providing a counter enable signal;

a first D flip-flop having a D input coupled to a first reference voltage representative of a first logic state, a clock input terminal for receiving a loop counter output signal, a set input terminal for receiving said standby signal, and a Q output terminal;

a second D flip-flop having a D input coupled to a second reference voltage representative of a second logic state, a clock input terminal for receiving a reference counter output signal, a reset input terminal coupled to said Q output terminal of said first D flip-flop, and a Q output terminal;

a first AND gate having a first input terminal coupled to said output terminal of said inverter, a second input terminal coupled to said Q output terminal of said second D flip-flop, and an output terminal for providing a phase detector enable signal;

an OR gate having a first input terminal coupled to said Q output terminal of said first D flip-flop, a second input terminal coupled to said Q output terminal of said second D flip-flop, and an output terminal; and a second AND gate having a first input terminal coupled to said output terminal of said OR gate, a second input terminal for receiving a voltage controlled oscillator output signal, and an output terminal for providing a loop counter input signal.

9. The standby control circuit of claim 8 further comprising delay means coupled to said set input of said first D flip-flop, for providing a predetermined delay between a change in logic state of said standby signal and a change in logic state at said set input of said first D flip-flop.

10. A phase locked loop comprising:

a reference counter having an input for receiving a reference signal, an enable input, and an output for providing a first signal once for each of a first number of cycles of said reference signal;

loop counter means having an input for receiving a loop signal, an enable input, and an output for providing a second signal once for each occurrence of a second number of cycles of said loop signal;

a phase detector having a first and second inputs respectively receiving said first and second signals, an enable input, and an output for providing a phase detect output signal;

a loop filter having an input coupled to said output of said phase detector, and an output;

a voltage controlled oscillator (VCO) having an input coupled to said output of said loop filter, and an output for providing a VCO output signal at a frequency proportional to a voltage at said output of said loop filter; and standby control means for activating said counter enable signal in response to a deactivation of said standby signal, for providing said phase detector enable signal in response to said counter enable signal and to said first signal after said deactivation of said standby signal, and for providing said loop signal in response to said VCO signal, after said deactivation of said standby signal and an activation of both said first and second signals.

11. The phase locked loop of claim 10 wherein said standby control circuit comprises:

an inverter having an input terminal for receiving a standby signal, and an output terminal for providing a counter enable signal;

a first D flip-flop having a D input coupled to a first reference voltage representative of a first logic state, a clock input terminal for receiving a loop counter output signal, a set input terminal for receiving said standby signal, and a Q output terminal;

a second D flip-flop having a D input coupled to a second reference voltage representative of a second logic state, a clock input terminal for receiving a reference counter output signal, a reset input terminal coupled to said Q output terminal of said first D flip-flop, and a Q output terminal;

a first AND gate having a first input terminal coupled to said output terminal of said inverter, a second input terminal coupled to said Q output terminal of said second D flip-flop, and an output terminal for providing a phase detector enable signal;

an OR gate having a first input terminal coupled to said Q output terminal of said first D flip-flop, a second input terminal coupled to said Q output terminal of said second D flip-flop, and an output terminal; and a second AND gate having a first input terminal coupled to said output terminal of said OR gate, a second input terminal for receiving said VCO output signal, and an output terminal for providing said loop signal.

12. The phase locked loop of claim 11 further comprising delay means coupled to said set input of said first D flip-flop, for providing a predetermined delay between a change in logic state of said standby signal and a change in logic state at said set input of said first D flip-flop.

* * * * *